(12) United States Patent
Grosse

(10) Patent No.: US 10,484,052 B2
(45) Date of Patent: Nov. 19, 2019

(54) METHOD AND DEVICE FOR TRANSMITTING ELECTRICAL POWER AND/OR SIGNALS BETWEEN A WALL AND A LEAF PIVOTABLE RELATIVE THERETO

(71) Applicant: DR. HAHN GMBH & CO. KG, Moenchengladbach (DE)

(72) Inventor: Burkhard Grosse, Pohlheim (DE)

(73) Assignee: DR. HAHN GMBH & CO. KG, Moenchengladbach (DE)

( * ) Notice: Subject to any disclaimer, the term of this patent is extended or adjusted under 35 U.S.C. 154(b) by 56 days.

(21) Appl. No.: 15/535,708

(22) PCT Filed: Dec. 2, 2015

(86) PCT No.: PCT/EP2015/078326
§ 371 (c)(1),
(2) Date: Jun. 14, 2017

(87) PCT Pub. No.: WO2016/096429
PCT Pub. Date: Jun. 23, 2016

(65) Prior Publication Data
US 2018/0359001 A1 Dec. 13, 2018

(30) Foreign Application Priority Data
Dec. 15, 2014 (DE) .................. 10 2014 118 597

(51) Int. Cl.
*H04B 5/00* (2006.01)
*E05D 11/00* (2006.01)
(Continued)

(52) U.S. Cl.
CPC ....... *H04B 5/0037* (2013.01); *E05D 11/0018* (2013.01); *E05D 11/0081* (2013.01); *G01R 33/072* (2013.01); *H02J 50/10* (2016.02); *H04B 5/005* (2013.01); *H04B 5/0025* (2013.01); *H04B 5/0093* (2013.01); *E05D 3/02* (2013.01);
(Continued)

(58) Field of Classification Search
CPC .... H04B 5/005; H04B 5/0093; H04B 5/0025; H04B 5/0037; H02J 50/70; H02J 50/10; G01R 33/072; G01R 33/12; E05D 11/0018; E05D 11/0081; E05D 3/02; E05D 2003/025; E05Y 2400/65; E05Y 2400/662; E05Y 2900/132; E05Y 2900/148

See application file for complete search history.

(56) References Cited

U.S. PATENT DOCUMENTS 8,344,881 B1 1/2013 Hays
8,847,580 B1 9/2014 Osterweil
(Continued)

FOREIGN PATENT DOCUMENTS

CN 102694583 A 9/2012
DE 39 15 812 A1 11/1990
(Continued)

*Primary Examiner* — Raymond S Dean
(74) *Attorney, Agent, or Firm* — Norman B. Thot

(57) ABSTRACT

A method for transmitting at least one of electrical power and signals between a wall and a leaf which can be pivoted relative to the wall. The method includes providing a transmission device, detecting a magnetic field strength in surroundings of the transmission device, and generating a fault signal when the magnetic field strength exceeds a threshold value.

1 Claim, 7 Drawing Sheets

(51) Int. Cl.
  *H02J 50/10*   (2016.01)
  *G01R 33/07*   (2006.01)
  *E05D 3/02*    (2006.01)

(52) U.S. Cl.
  CPC ..... *E05D 2003/025* (2013.01); *E05Y 2400/65* (2013.01); *E05Y 2400/662* (2013.01); *E05Y 2900/132* (2013.01); *E05Y 2900/148* (2013.01)

(56) References Cited

U.S. PATENT DOCUMENTS

| | | | |
|---|---|---|---|
| 2007/0139195 A1 | 6/2007 | Jin et al. | |
| 2008/0073993 A1* | 3/2008 | Sortore | F16C 32/0459 310/90.5 |
| 2009/0251308 A1* | 10/2009 | Schweitzer, III | G01R 31/025 340/539.1 |
| 2010/0013461 A1* | 1/2010 | Masubuchi | G01R 33/288 324/201 |
| 2011/0121986 A1* | 5/2011 | Kopp | A61B 5/055 340/657 |
| 2012/0293170 A1* | 11/2012 | Nakajima | B82Y 25/00 324/252 |
| 2014/0001880 A1 | 1/2014 | Herglotz et al. | |
| 2015/0333795 A1 | 11/2015 | Steudtner | |
| 2017/0032879 A1* | 2/2017 | Dai | H01F 30/16 |

FOREIGN PATENT DOCUMENTS

| | | |
|---|---|---|
| DE | 10 2008 047 194 A1 | 4/2010 |
| EP | 2 163 713 A2 | 3/2010 |
| JP | 2013-257890 A | 12/2013 |
| WO | WO 2012/123040 A1 | 9/2012 |
| WO | WO 2014/095421 A1 | 6/2014 |
| WO | WO 2014/138776 A1 | 9/2014 |

\* cited by examiner

US 10,484,052 B2

METHOD AND DEVICE FOR TRANSMITTING ELECTRICAL POWER AND/OR SIGNALS BETWEEN A WALL AND A LEAF PIVOTABLE RELATIVE THERETO

CROSS REFERENCE TO PRIOR APPLICATIONS

This application is a U.S. National Phase application under 35 U.S.C. § 371 of International Application No. PCT/EP2015/078326, filed on Dec. 2, 2015 and which claims benefit to German Patent Application No. 10 2014 118 597.8, filed on Dec. 15, 2014. The International Application was published in German on Jun. 23, 2016 as WO 2016/096429 A1 under PCT Article 21(2).

FIELD

The present invention relates to a method and to a device for transmitting electrical power and/or signals between a wall and a leaf which can be pivoted relative to the wall, comprising a transmission device.

BACKGROUND

Such a method and such a device are described in DE 39 15 812 A1 where concentrically arranged coils or a cylindrically designed condenser are provided for power transmission. A signal transmission is also supposed to take place by means of the coils or the condenser or by radio.

This device is disadvantageous because the transmission can be influenced or interrupted by outside magnetic fields at least when the power and/or signal is also transmitted inductively. It is possible to influence a transmission of electrical power from a wall to a leaf and a signal transmission between the wall and the leaf, or vice versa, which, for example, is used to control and monitor the function of devices located in the leaf, by purposefully applying a magnetic field so as to no longer ensure the functionality of the device.

For improving operational safety, WO 2012/123040 A1 therefore describes means for shielding the transmission device against outside magnetic fields. These means can in particular comprise housings made of magnetically soft materials which encompass transmission devices.

The space requirement connected with these shielding means is disadvantageous, however, because relatively small-sized devices cannot be provided with such means. The constructive effort in connection with the production of such a device furthermore increases significantly due to additional housings.

SUMMARY

An aspect of the present invention is to provide a device of the initially described type that is effectively protected against the influence of an outside magnetic field with less constructive effort.

In an embodiment, the present invention provides a method for transmitting at least one of electrical power and signals between a wall and a leaf which can be pivoted relative to the wall. The method includes providing a transmission device, detecting a magnetic field strength in surroundings of the transmission device, and generating a fault signal when the magnetic field strength exceeds a threshold value. The present invention also provides a device for transmitting at least one of electrical power and signals between a wall and a leaf which is mounted so as to pivot on the wall which includes a transmission device which comprises a device for detecting a magnetic field strength in surroundings of the transmission device.

BRIEF DESCRIPTION OF THE DRAWINGS

The present invention is described in greater detail below on the basis of embodiments and of the drawings in which.

DETAILED DESCRIPTION

Figure 1:
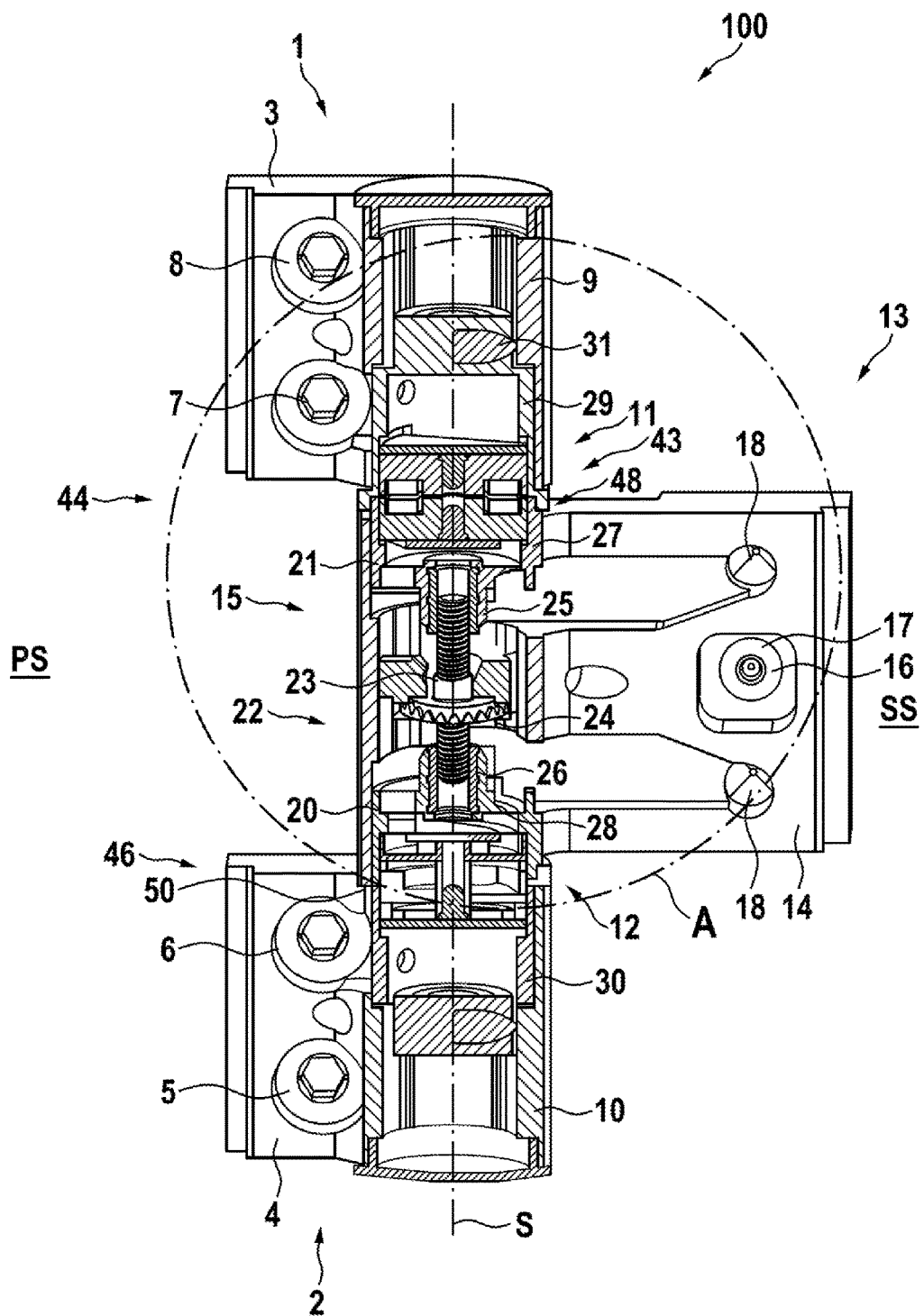
FIG. 1 shows a partial longitudinal section of an embodiment of the device according to the present invention.

According to the present invention, the magnetic field strength is detected in the surroundings of the transmission device and a fault signal is generated when the magnetic field strength exceeds a threshold value. The present invention is thus a departure from the teaching of WO 2012/123040 A1 because it does not attempt to shield harmful outside magnetic fields which can, for example, be generated deliberately for the purpose of sabotage, but instead detects the magnetic fields with the objective that, in case a threshold value, above which the functionality of the transmission device would be at risk, is exceeded, a signal is generated which is, for example, applied to an intrusion alarm control, and for the protection of the system, purposefully adjusts or deactivates individual system parts of the power transmission. The application of the latter can take place in an analog manner as an application with a signal of a different sensor, for example, a glass breakage sensor.

The method according to the present invention can be performed with an electric circuit arrangement for detecting the magnetic field strength which is operated with a predetermined supply voltage and which is designed so that, in case of the detection of a magnetic field of a strength exceeding a threshold value, the power requirement of the circuit arrangement increases and the increase of the power requirement is used to generate the fault signal. In other words, the information "external magnetic field detected" is transmitted, for example, by current modulation.

As mentioned before, the fault signal can, for example, be forwarded to an intrusion alarm control. The fault signal can subsequently be evaluated and processed by the intrusion alarm control as an intrusion or sabotage attempt and the safety measures provided for a respective intrusion or sabotage attempt executed.

The application of the method according to the present invention is at least advantageous for an increase of the operational safety in case of the transmission of electrical power and/or signals between a wall and a leaf if the transmission is at least also effected inductively because inductive transmission components can in particular be influenced and/or interrupted by outside magnetic fields.

The device for executing the method according to the present invention comprises a device for detecting the magnetic field strength in surroundings of the transmission device.

The transmission device for transmitting electrical power and/or signals between the wall and the leaf can in particular comprise a coil arrangement on both the side of the wall and on the side of the leaf. These coil arrangements can, for example, have coil windings embedded in the coil housings. The two housing can, for example, consist of a magnetically soft material which are designed so that a magnetic coupling with a, for example, low scatter field is caused between the two coils.

The device for detecting the magnetic field strength can, for example, comprise a magnetic field sensor which can, for example, have a reed sensor and/or a Hall sensor. These components can, for example, be arranged so that the magnetic fields, above which the coil arrangement on the wall and the leaf is located in inductive operative connection, do not flow therethrough.

For this purpose, the magnetic field sensor can be provided on a board of the electric circuit arrangement, wherein the board is provided on an outer side of the housing of a coil arrangement. This can in particular be the outer side of a closed front of a housing which faces away from the other coil arrangement.

In an embodiment of the present invention, the board can, for example, additionally comprise a transmitter and/or a receiver of an opto-electronic signal transmission device. It is possible to transmit both electrical power and signals through suitable modulation via one and the same pair of coils on the side of the wall and the leaf. However, since an interaction of power and signal transmission cannot be precluded, and an optimized power transmission regularly requires a different constructive adjustment of the coil arrangement than an optimized signal transmission, the opto-electronic signal transmission is also provided in this development. The opto-electronic signal transmission can, for example, be part of a control loop for controlling the power which is applied to the coil on the wall on the basis of the power requirement on the side of the leaf. However, alternatively or additionally, it can, for example, also transmit the respective operational conditions of devices located in the leaf between the leaf and the wall as well as control signals to those devices from the wall to the leaf.

The present invention shall be explained in more detail below using the drawings which depict an embodiment of a device according to the present invention.

The device, denoted in FIG. 1 in its entirety with 100, comprises two wall parts 1, 2 which are spaced apart in the direction of a hinge axis S which are attachable on a wall (not shown in the drawing) which has a door or window opening. The above and following use of the term "wall" includes a frame or a casing which is usually provided on the wall in the area of a door or wall opening.

The wall parts 1, 2 comprise fastening parts 3, 4. Each fastening part 3, 4 has bores 5, 6, 7, 8 for receiving one fastening screw each or for feeding electrical and/or optical cables therethrough. These cables (which are not shown in the drawing) are used for providing electrical or optical connections of the power and signal transmitters and associated electronic or opto-electronic circuits as will be described in greater detail below.

The wall usually forms a primary side PS, from which electrical power is transmitted to the leaf, which is thus the secondary side SS.

One receiving part 9, 10 for receiving components from power and signal transmission assemblies 11, 12 are molded onto the fastening parts 3, 4. In the herein described embodiment, the power and signal transmission assemblies 11, 12 form power and signal transmission devices 44, 46. In the described embodiment, the power transmission assembly 11 comprises a transmission device 19 having a coil arrangement on the side of the wall 32 and a coil arrangement on the side of the leaf 45.

The device 100 further comprises a leaf part 13 which engages in the clearance formed between the wall parts 1, 2. The device 100 also has a fastening part 14 and a receiving part 15 molded onto the fastening part 14. A bore 16 for a fastening screw 17 is provided on the fastening part 14 with which the leaf part 13 can be mounted to a leaf (not shown in the drawing). The fastening part 14 also has bores 18 which are used for feeding electrical and/or optical cables 19 therethrough (which are not shown in the drawing). These cables serve as connection of the power and signal transmission assemblies 11, 12 with electronic or opto-electronic circuits on the side of the leaf, in this case primary electronics 60 and secondary electronics 75.

The receiving part 15 is used for receiving components for power and signal transmission assemblies 11, 12 on the side of the leaf. The components on the side of the leaf comprise two bearing bushings 20, 21 which are spaced apart in the direction of the hinge axis S and which are slidably mounted relative to one another in this direction. A spindle drive 22 is used for the shifting and immobilization in a desired position. The spindle drive 22 comprises an adjusting spindle 23 which comprises a crown wheel 24 in the center. The crown wheel 24 is used for the optional application of a turning tool (not shown in the drawing) or for engaging a rotary actuation device (also not shown in the drawing). The adjusting spindle 24 also has two threaded sections 25, 26 which in the reverse sense comprise formed external threads. The two threaded sections 25, 26 engage in complementary internal threads 27, 28 of the bearing bushings 20, 21. Via a rotary actuation of the spindle drive 22, the bearing bushings 20, 21 can thus be moved in the direction of the hinge axis S in order to be adjusted between an installation position, in which the bearing bushings 20, 21 have minimal distance to one another, and an operating position, in which the bearing bushings 20, 21 are at least almost bearing against bearing bushings 29, 30 in the receiving parts 9, 10 of the wall parts 1, 2.

Figure 2:
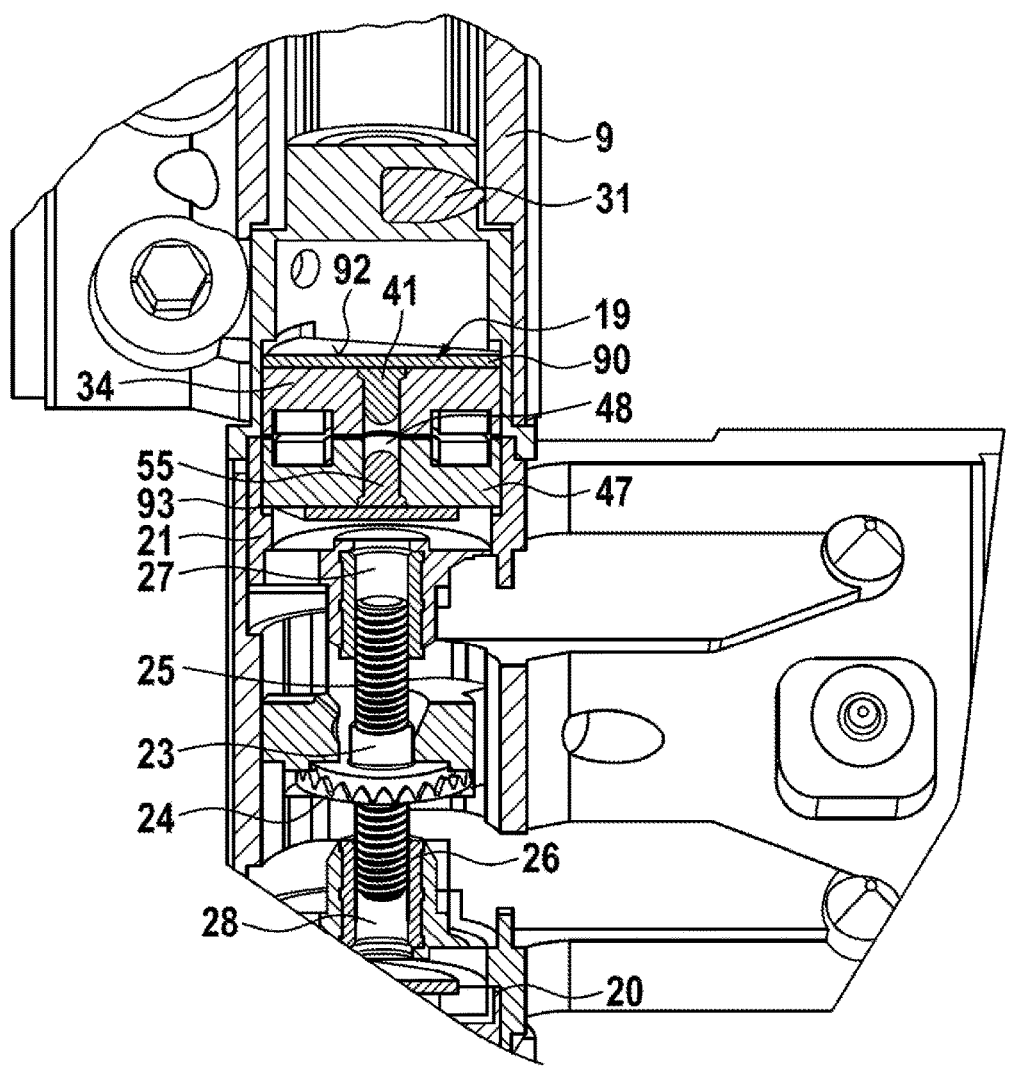
FIG. 2 shows an enlarged depiction of section A in FIG. 1.

The structure and the principle of operation of the power and signal transmission assemblies shall be explained in greater detail below under reference to FIGS. 2 to 4.

In addition to the bearing bushing 21, which is mounted slidably via the adjusting spindle 23 in the receiving part 15 of the leaf part 13, the power transmission assembly 11 comprises the bearing bushing 29, which is arranged in the receiving part 9. The functionally corresponding bearing bushing 30 is correspondingly arranged in the receiving part 10 of the lower wall part 2 (see FIG. 1). A movability of the bearing bushings 29, 30 in the direction of the hinge axis S is not provided. The upper bearing bushing 29 comprises a radially protruding clamping 31 to provide that it is non-rotatably mounted and does not drop down by itself after a possible removal of the leaf part 13.

In the bearing bushing 29, a coil arrangement 32, also called "primary coil arrangement," is arranged on the side of the wall. The primary coil arrangement 32 comprises a coil housing 34 which can consist of a magnetically soft, particularly ferritic material. The coil housing 34 has a central core 36 around which a coil winding 38 is guided. Coil winding 38 is shown only schematically in the drawing. A central bore 40 is provided in the central core 36. The central bore 40 is used to receive an opto-electronic transmission/receiving unit 41 which is part of a first opto-electronic signal transmission device 43. The opto-electronic transmission/receiving unit 41 is mounted on a board 90.

The board 90 contains an electronic circuit for operating the opto-electronic transmission/receiving unit 41. For that purpose, it is connected with the switch converter 73 of the primary electronics 60 by a two-core line 91; the switch converter 73 also provides the necessary operating voltage and the necessary operating current for the operation of the opto-electronic transmission/receiving unit 41.

Figure 7:
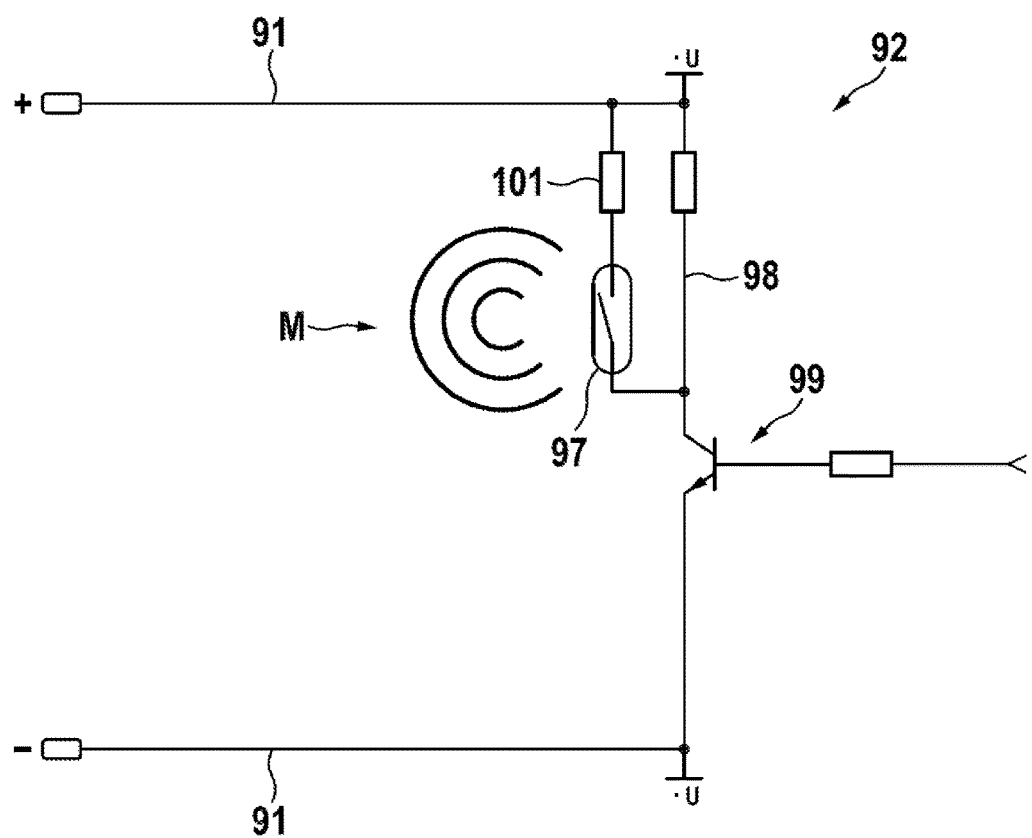
FIG. 7 shows a principle circuit diagram of an electronic circuit for generating a fault signal when detecting a magnetic field above a threshold value in the surroundings of the transmission device.

The board 90 further comprises a device for detecting the magnetic field strength 92, a principle circuit diagram of which is shown in FIG. 7, and which has a magnetic field sensor 97 designed as a reed switch in the shown embodiment. The electric circuit of the board 90 is designed so that, in case a magnetic field is detected, the magnetic field strength of which exceeds a threshold value, the power requirement of the electric circuit is increased significantly via the reed switch or the Hall sensor, and said increase of the power requirement is used to generate a fault signal which symbolizes the detection of an outside magnetic field. For that purpose, a transistor 99, which is part of the return channel for adequately controlling the power provided by the primary coil arrangement 32, a series circuit, consisting of a magnetic field sensor 97 and resistor 101, are connected in parallel to a basic line 98. If an outside magnetic field M causes the magnetic field sensor 97 to be switched to pass, a significant increase of the power requirement results.

The board 90 is arranged on the outside of the coil housing 34 in order to provide that the device for detecting the magnetic field strength 92 is not influenced by magnetic fields which are generated by a current flow through the coil winding 38.

A coil arrangement 45 on the side of the leaf, also called secondary coil arrangement, is arranged in the receiving part 15 of the leaf part 13. The secondary coil arrangement 45 comprises a coil housing 47 with a core 49, around which a coil winding 51 is wound.

The coil housing 47 has a central bore 53 which extends through the core 49. It serves as a receptacle of an opto-electronic transmission/receiving unit 55. The opto-electronic transmission units 41, 55 are synchronized so that a signal transmission is possible at least in one direction, for example, bidirectionally. Both opto-electronic transmission/receiving units 41, 55 together form a first opto-coupler 48. The opto-electronic transmission/receiving unit 55 is arranged on a board 93. Board 93 comprises an electric circuit suitable for the operation of the opto-electronic transmission/receiving unit 55 and the signal transmission via a two-core line 94. In the shown embodiment, a device for detecting the magnetic field strength 92 of an outside magnetic field is not provided on the board 93.

Figure 3:
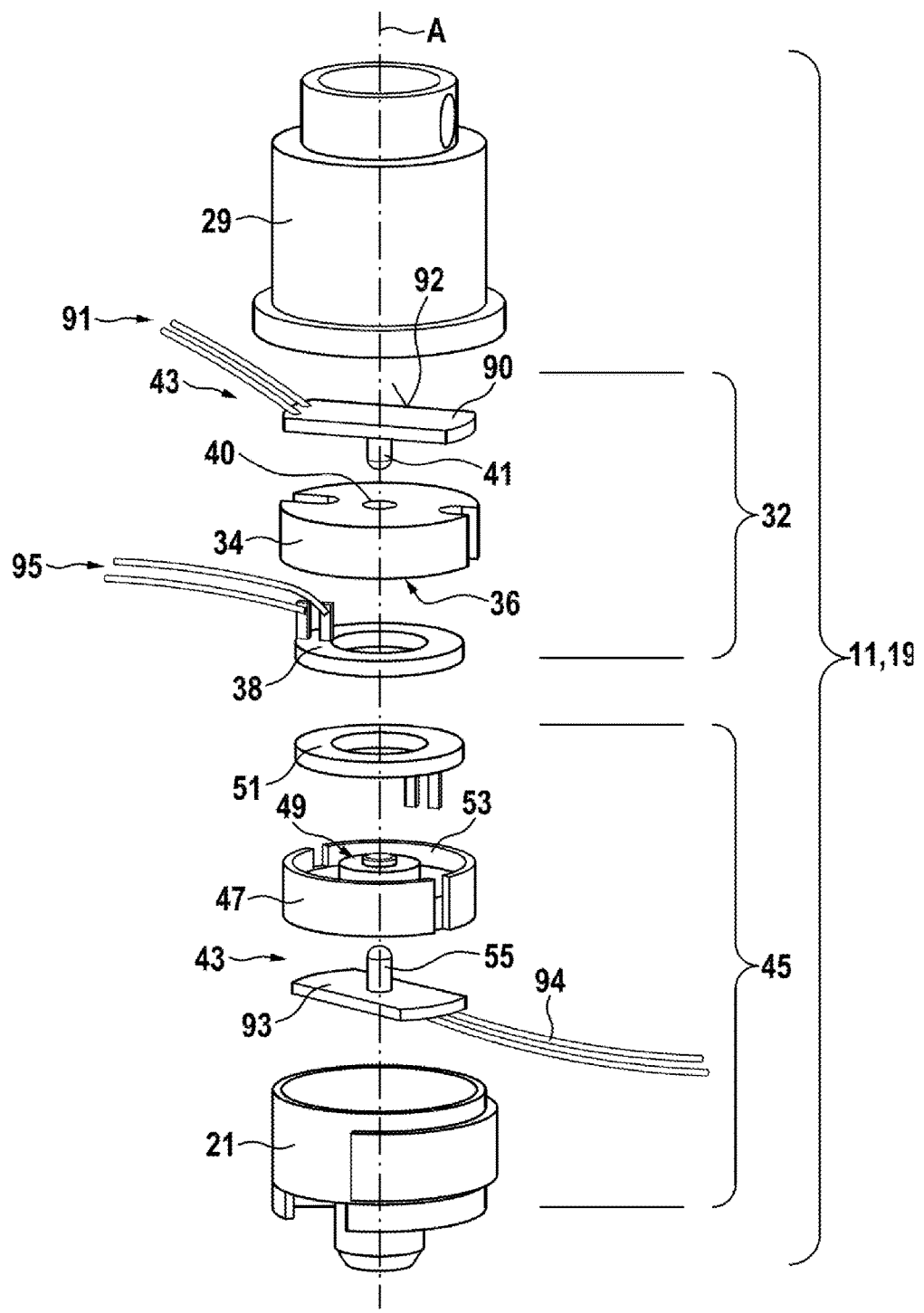
FIG. 3 shows a perspective exploded view of a power transmission assembly comprising a power transmission device and a first opto-coupler.

FIG. 3 shows a perspective exploded view where the components of the power transmission assembly 11 are arranged approximately symmetrically to a central axis A. This axis A coincides approximately with the hinge axis S when installed.

Figure 4:
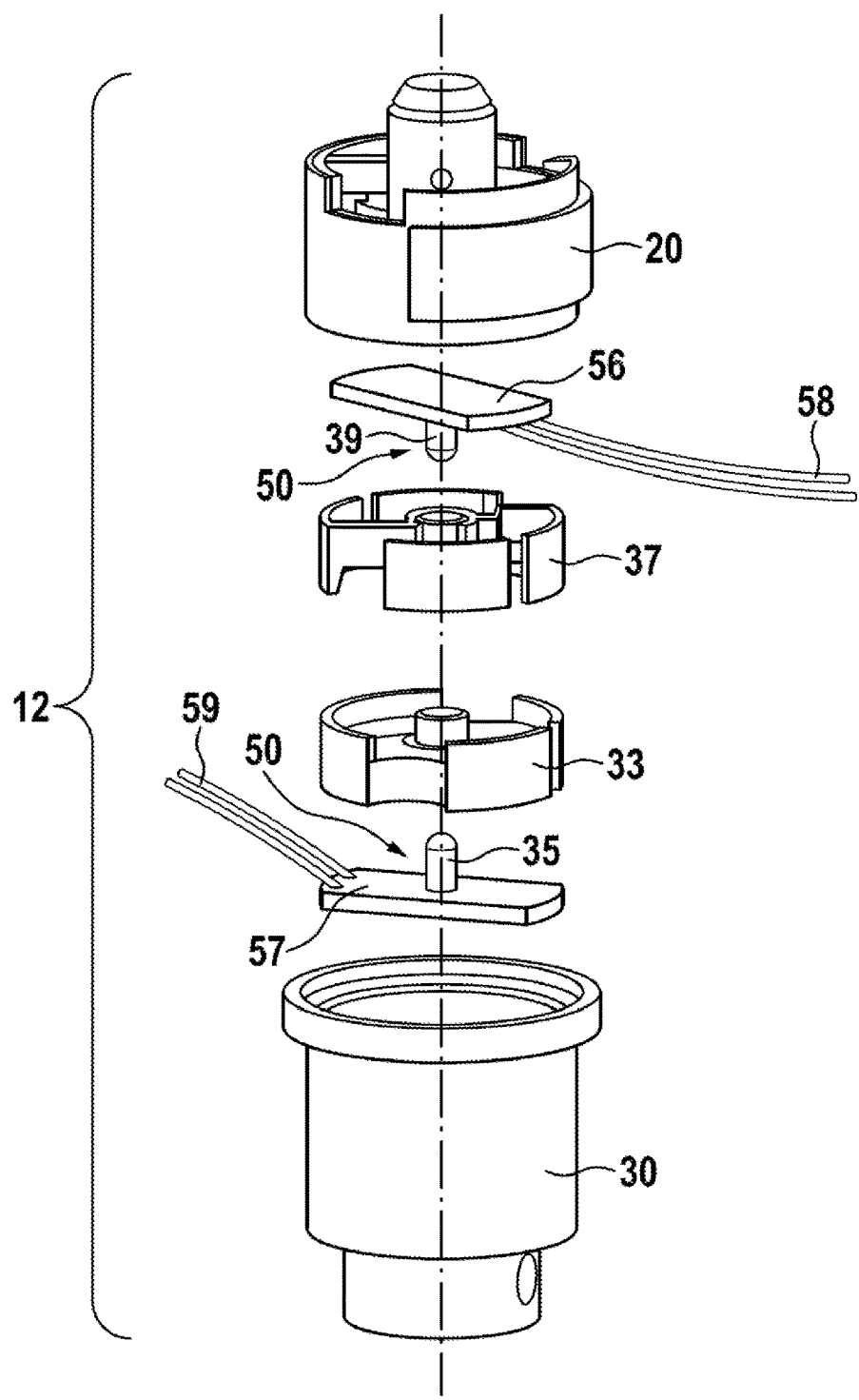
FIG. 4 shows a perspective exploded view of a power transmission assembly comprising a second opto-coupler.

FIG. 4 shows the signal transmission assembly 12 which somewhat corresponds to the depiction in FIG. 3. Signal transmission assembly 12 comprises the bearing bushing 30, a first carrier 33, a first opto-electronic transmission/receiving unit 35, a second carrier 37, a second opto-electronic transmission/receiving unit 39, and the bearing bushing 20. The opto-electronic transmission/receiving units 35, 39 together form a second opto-coupler 50 and are each arranged on a board 56, 57. Both boards 56, 57 comprise electric circuits for operating the corresponding opto-electronic transmission/receiving unit via a corresponding two-core line 58, 59. The boards 56, 57 are mounted on the front sides of the respective carriers 33, 37, with the front sides facing away from each other.

The signal transmission assembly 12 does not comprise coil arrangements. The carriers 30, 37 can be made of a plastic material. Since there is thus no inductive power and/or signal transmission, no device for detecting an outside magnetic field strength is provided on either of boards 56, 57.

Figure 5:
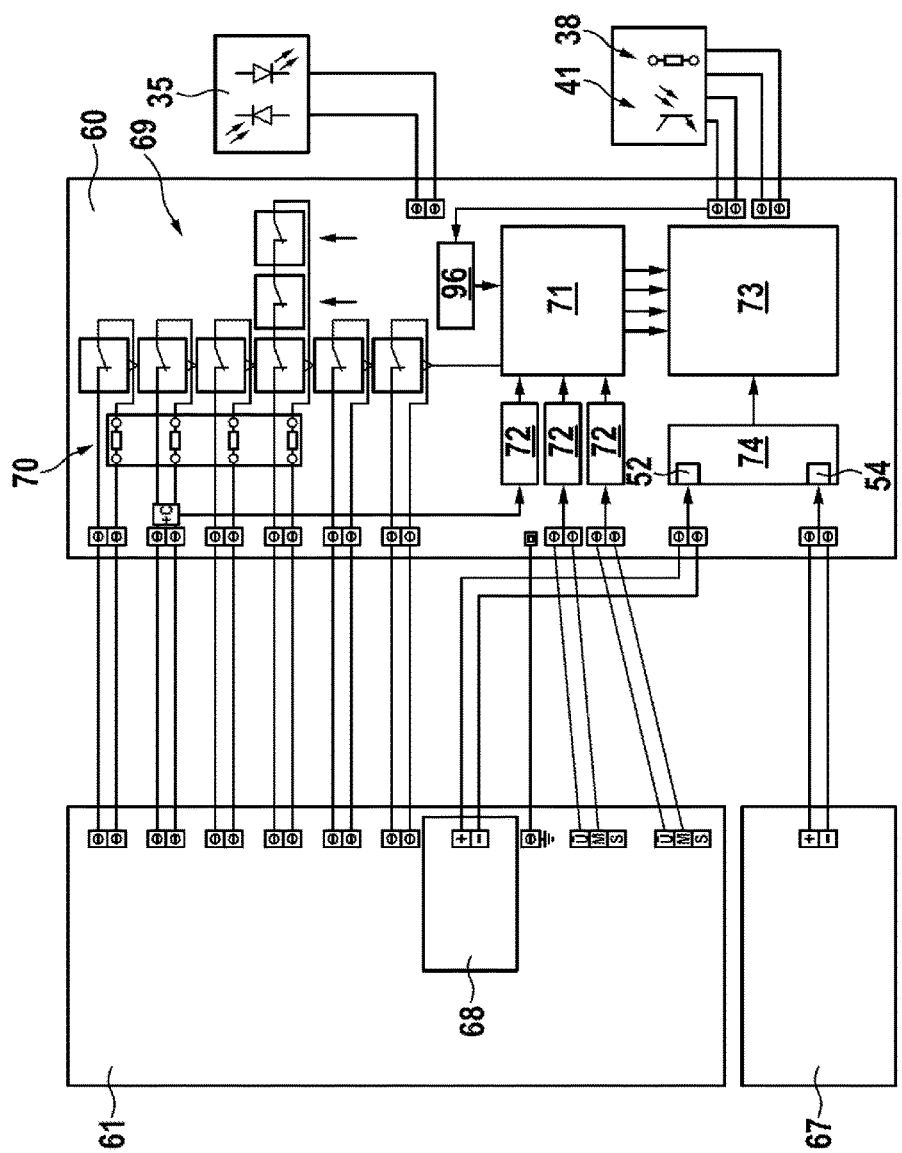
FIG. 5 shows a block diagram of an electric circuit on the side of the wall.
Figure 6:
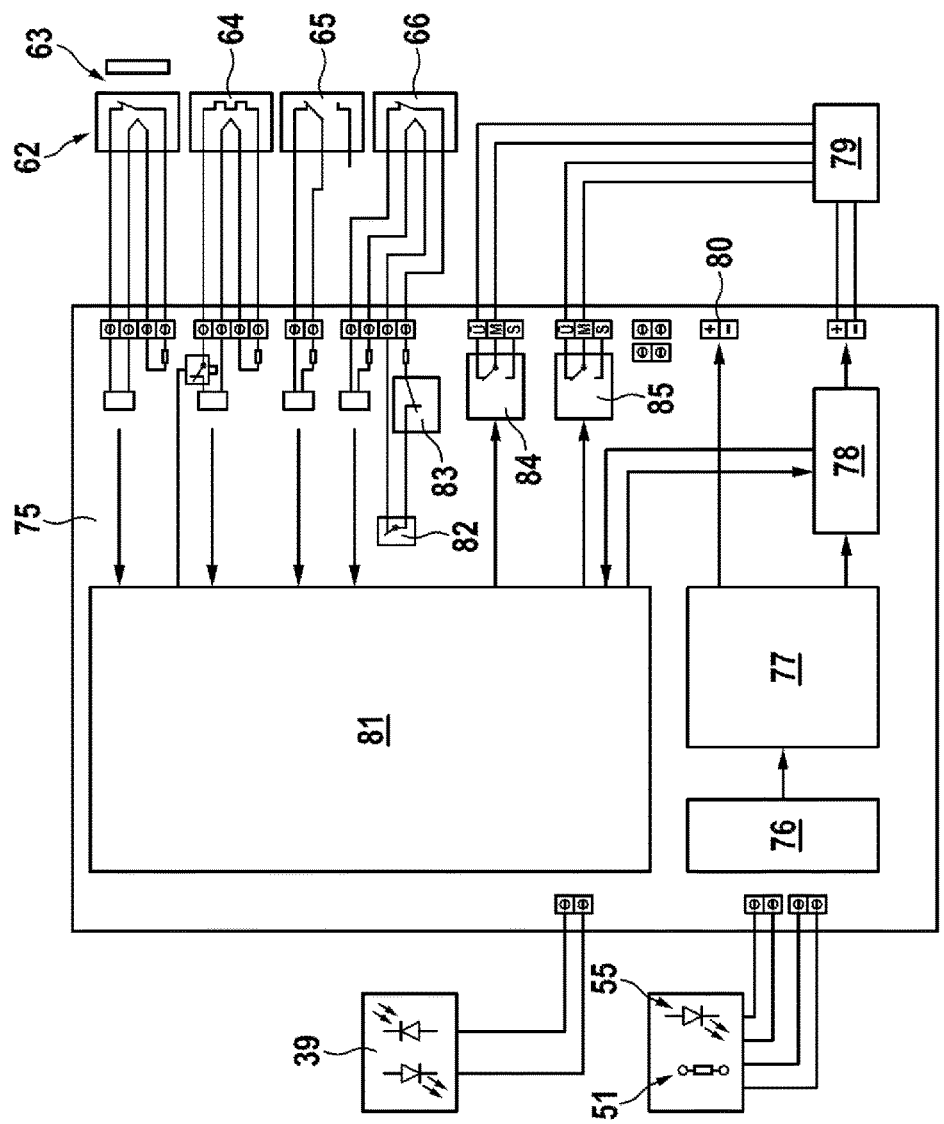
FIG. 6 shows a block diagram of an electric circuit on the side of the leaf.

The electric circuit on the side of the frame, depicted in FIG. 5 as a block diagram, comprises primary electronics 60 which, among others, are used to provide the electric power on the basis of the actuation and operational power requirement on the side of the leaf. For that purpose, the primary electronics 60 are electrically connected to the opto-electronic transmission/receiving unit 41 by line 91, and to the coil winding 38 of the primary coil arrangement 32 by a two-core line 95.

In order to be able to bidirectionally transmit signals between the control and evaluating unit on the side of the wall (formed in the shown embodiment by an intrusion alarm control 61, signal transmitters 62 in the form of magnetic contacts 63 on the side of the leaf, glass breakage sensors 64, make contacts 65, as well as sabotage contacts 66) the primary electronics 60 are additionally electrically connected to the first opto-electronic transmission/receiving unit 35.

The primary electronics 60 are further electrically connected to a power adapter 67 which, if necessary, provides the actuation power on the side of the leaf, as well as a buffered current supply 68 which is part of the intrusion alarm control 61 and which, in case of a supply voltage failure or a technical defect of the power adapter 67, is used to provide the operational power requirement of the signal transmitter 62 on the side of the leaf. The power adapter 67 can be omitted if there is no consumer on the side of the leaf.

The primary electronics 60 further comprise multiple relays 69 which reproduce signals that are transmitted from an opening, breach, and lock monitoring device and to an assembly monitoring device. They are connected with the corresponding inputs of the intrusion alarm control 61, wherein connecting resistors 70 are series-connected to the connecting lines. Relays for a pry contact and the signal indicating an outside magnetic field as well as the transmission of interferences transmitted by a "watchdog" are also provided.

Based on the signals transmitted by the first opto-electronic transmission/receiving unit 35, the relays 69 are controlled by a processor 71 of the primary electronics 60. Via the evaluation electronics 72, the processor 71 receives information about the detector group voltage as well as signals of the intrusion alarm control 61, for example, for a lock and latch control.

The processor 71 is furthermore connected to a switch converter 73 which applies electrical power as feedback to the coil winding 38 via the opto-electronic transmission/receiving unit 41 on the basis of the power requirement determined by the processor 71.

This electrical power is provided to the switch converter 73 by a switchover 74 during normal operational conditions from the power adapter 67, or in case of a supply voltage failure from the buffered current supply 68. The switchover 74 comprises a first electrical energy buffer 54. This first electrical energy buffer 54 is used to provide the actuator powers on the side of the leaf in the event that the supply voltage fails during an actuation process of a consumer 79. A deactivation of the actuation process is thereby avoided in the event of a supply voltage failure. The actuation power on the side of the leaf and the operating power on the side of the leaf are basically provided (as long as a consumer 79 is present) via a power adapter 67. Only in the event of a failure of the supply voltage provided by the power adapter 67 is a switch to the buffered current supply effected by the switchover 74. The switchover 74 may comprise a second electrical energy buffer 52 which can also be used to provide electrical power in the event of a failure of the buffered current supply 68. The uninterrupted operation of the safety-relevant secondary circuit parts is thus provided. Regardless of the further design of the device 100, the specified manner of the electrical energy supply of the primary electronics 60 by the switchover 74 can be used to increase the operational safety of a galvanically separated application of electrical power of an electrical consumer provided on a leaf.

In order to convert the electrical direct current voltage provided in the switch converter 73 by the switchover 74 into alternating voltage suitable for an application of the coil winding 38 on the side of the leaf, and thus the transmission by induction of a secondary alternating voltage in the coil winding 51 of the secondary coil arrangement 45 on the side of the leaf, the switch converter 73 comprises a particular variation of a flyback converter. This flyback converter comprises an H-bridge with four high-performance MOSFETs. The MOSFETs are controlled by MOSFET drivers which are controlled by an intelligent logic. A controller is used for this purpose which is optimized for this application so that both the intelligent quick control of the H-bridge and the program sequence for monitoring and controlling of all functionalities of the secondary electronics 75 are realized independently from each other in the tightest of spaces. It is thus possible for the controller, during its program sequence, to influence the control of the H-bridge; however, a retroactive influencing of the program sequence of the controller by the control of the H-bridge is not possible.

The coil winding 51 on the side of the leaf is electrically connected to secondary electronics 75 on the side of the leaf. This alternating voltage is applied to a rectifier 76 which rectifies this alternating voltage. Via a buffer, this direct current voltage is fed smoothed to a current supply 77 of the secondary electronics 75. Among others, this current supply 77 is connected to an overcurrent detection and load separation circuit 78. It comprises a power output which can be connected to electrical consumers 79 which are provided on the side of the leaf.

The current supply 77 further comprises a stabilized, short-circuit-proof direct-current voltage output 80 on which seismic detectors can, for example, be connected and provided with operating voltage.

The processor 81 is provided with the necessary operating power via the current supply 77. Via a signal line, the processor 81 is further connected to overcurrent detection and load separation circuit 78 in order to effect a load separation, if needed.

The opto-electronic transmission/receiving units 55 and 39 are also connected to the secondary electronics 75.

During operation of the arrangement, electrical power is applied by the switch converter 73 to the coil winding 38 of the primary coil arrangement 32; the electrical power being required to adequately provide the actuating and operating power in the secondary coil winding 51 of the secondary coil arrangement 45. This is controlled by a feedback channel which is galvanically separated by the opto-electronic transmission/receiving units 41, 55 and acts directly in hardware on the control of the H-bridge of the switch converter 73. Due to this type of control, a flyback converter, which is exclusively realized in hardware, is used; the flyback converter does not require a software-controlled program sequence with corresponding delay response times. Operational conditions may, however, occur in which the on/off frequency of the flyback converter lies in the audible range. The control frequency can be changed to be software-controlled via the controller in such a case. However, an operational condition can also occur without software control in which the system would change over to an overload condition. Such a condition can also be prevented by a software-controlled deactivation of the flyback converter.

This channel further serves to detect a possible outside magnetic field.

As was already explained above, a device for detecting the magnetic field strength 92 is provided on the board 90 carrying the opto-electronic transmission/receiving unit 41. This device is designed so that the power requirement of the board 90 significantly increases when such a magnetic field is detected, that the increase is interpreted as fault signal by an evaluation unit 96 upstream of the processor 71, and so that the associated relay can be controlled correspondingly.

During operation, a bidirectional signal transmission via the first opto-electronic transmission/receiving unit 35 and the second opto-electronic transmission/receiving unit 39 furthermore takes place. The operational conditions of the signal transmitters 62 of the intrusion alarm control 61 can be provided with this bidirectional signal transmission, and the processor 81 and the signal transmitters 62 and, if applicable, further consumers can be controlled from the intrusion alarm control 61.

The secondary electronics 75 further comprise a safety contact 82 for lid monitoring, and a safety contact 83 for pry protection. Relays 84, 85 are further provided as a lock and latch control of the consumer 79 which is designed as a motor lock.

Any type of remote controlled switch can be used as a relay. In the described embodiment, an electro-optically operating switch is used.

The present invention is not limited to embodiments described herein; reference should be had to the appended claims.

LIST OF REFERENCE NUMERALS

| | |
|---|---|
| 100 | Device |
| 1 | Wall part |
| 2 | Wall part |
| 3 | Fastening part |
| 4 | Fastening part |
| 5 | Bore |
| 6 | Bore |
| 7 | Bore |
| 8 | Bore |
| 9 | Receiving part |
| 10 | Receiving part |
| 11 | Power transmission assembly |
| 12 | Signal transmission assembly |
| 13 | Leaf part |
| 14 | Fastening part |
| 15 | Receiving part |

-continued

| | | |
|---|---|---|
| 16 | Bore | |
| 17 | Fastening screw | |
| 18 | Bores | |
| 19 | Transmission device | |
| 20 | Bearing bushing | |
| 21 | Bearing bushing | |
| 22 | Spindle drive | |
| 23 | Adjusting spindle drive | |
| 24 | Crown wheel | |
| 25 | Threaded section | |
| 26 | Threaded section | |
| 27 | Complementary internal threads (Threaded section) | |
| 28 | Complementary internal threads (Threaded section) | |
| 29 | Bearing bushing | |
| 30 | Bearing bushing | |
| 31 | Clamping | |
| 32 | Coil arrangement on the side of the wall/ Primary coil arrangement | |
| 33 | First carrier | |
| 34 | Coil housing | |
| 35 | First opto-electronic transmission/receiving unit | |
| 36 | Central core | |
| 37 | Second carrier | |
| 38 | Coil winding | |
| 39 | Second opto-electronic transmission/receiving unit | |
| 40 | Central bore | |
| 41 | Opto-electronic transmission/receiving unit | |
| 43 | First opto-electronic signal transmission device | |
| 44 | Power transmission device | |
| 45 | Coil arrangement on the side of the leaf/ Secondary coil arrangement | |
| 46 | Signal transmission device | |
| 47 | Coil housing | |
| 48 | First opto-coupler | |
| 49 | Core | |
| 50 | Second opto-coupler | |
| 51 | Coil winding | |
| 52 | Second electrical energy buffer | |
| 53 | Central bore | |
| 54 | First electrical energy buffer | |
| 55 | Opto-electronic transmission/receiving unit | |
| 56 | Board | |
| 57 | Board | |
| 58 | Two-core line | |
| 59 | Two-core line | |
| 60 | Primary electronics | |
| 61 | Intrusion alarm control | |
| 62 | Signal transmitter | |
| 63 | Magnetic contacts | |
| 64 | Glass breakage sensor | |
| 65 | Make contacts | |
| 66 | Sabotage contacts | |
| 67 | Power adapter | |
| 68 | Buffered current supply | |
| 69 | Relays | |
| 70 | Connecting resistors | |
| 71 | Processor | |
| 72 | Evaluation electronics | |
| 73 | Switch converter | |
| 74 | Switchover | |
| 75 | Secondary electronics | |
| 76 | Rectifier | |
| 77 | Current supply | |
| 78 | Overcurrent detection and load separation circuit | |
| 79 | Consumer | |
| 80 | Direct-current voltage output | |
| 81 | Processor | |
| 82 | Safety contact | |
| 83 | Safety contact | |
| 84 | Relay | |
| 85 | Relay | |
| 90 | Board | |
| 91 | Two-core line | |
| 92 | Device for detecting the magnetic field strength | |
| 93 | Board | |
| 94 | Two-core line | |
| 95 | Two-core line | |
| 96 | Evaluation unit | |
| 97 | Magnetic field sensor | |
| 98 | Basic line | |
| 99 | Transistor | |
| 101 | Resistor | |
| M | Magnetic field | |
| PS | Primary side | |
| S | Hinge axis | |
| SS | Secondary side | |

What is claimed is:

1. A device for transmitting at least one of electrical power and signals between a wall and a leaf which is mounted so as to pivot on the wall, the device comprising:
 a transmission device which comprises,
  a device for detecting a magnetic field strength in surroundings of the transmission device, the device for detecting a magnetic field strength comprising a magnetic field sensor which is designed as at least one of a reed switch and a Hall sensor,
  a coil arrangement arranged on a side of the wall, and
  a coil arrangement arranged on a side of the leaf;
 a coil arrangement comprising a coil housing and a coil winding; and
 an electrical circuit arrangement comprising a board, wherein,
 the magnetic field sensor is arranged on the board,
 the board is arranged on an outer side of the coil housing,
 the board comprises a transmission and/or receiving unit of an opto-electronic signal transmission device, and
 the opto-electronic signal transmission device is provided as a part of a control loop for controlling power which is applied to the coil winding on the side of the wall which based on a power requirement of the side of the leaf.

* * * * *